(12) United States Patent
Zatelli et al.

(10) Patent No.: US 6,313,480 B1
(45) Date of Patent: Nov. 6, 2001

(54) STRUCTURE AND METHOD FOR EVALUATING AN INTEGRATED ELECTRONIC DEVICE

(75) Inventors: Nicola Zatelli, Bergamo; Carlo Cremonesi, Vaprio d'Adda, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/209,049

(22) Filed: Dec. 9, 1998

(30) Foreign Application Priority Data

Dec. 10, 1997 (IT) ............................................... TO97A1073

(51) Int. Cl.⁷ .................................................. H01L 23/58
(52) U.S. Cl. .................................. 257/48; 438/14; 438/15
(58) Field of Search .................................. 257/48; 438/14, 438/15, 16, 17, 18; 356/381; 117/85

(56) References Cited

U.S. PATENT DOCUMENTS

| | | | |
|---|---|---|---|
| 3,774,088 | * 11/1973 | Magdo et al. | 257/48 |
| 5,397,909 | * 3/1995 | Moslehi | 257/383 |
| 5,801,538 | * 9/1998 | Kwon | 438/18 |
| 5,863,807 | * 1/1999 | Jang et al. | 438/14 |
| 6,010,914 | * 1/2000 | Shishiguchi | 438/14 |
| 6,121,631 | * 9/2000 | Gardner | 257/48 |
| 6,153,892 | * 11/2000 | Ohsono | 257/48 |

\* cited by examiner

*Primary Examiner*—Olik Chaudhuri
*Assistant Examiner*—Nathan W. Ha
(74) *Attorney, Agent, or Firm*—Robert Iannucci; Seed IP Law Group, PLLC

(57) ABSTRACT

The structure allows checking an integrated electronic device comprising an oxide layer to be measured located above a doped pocket of a wafer of doped semiconductor material and arranged adjacent to a gate region of polycrystalline semiconductor material. The structure is formed at a suitable point of the wafer and comprises an oxide test region of the same material, having the same thickness and the same electrical characteristics as the oxide layer to be measured and a polycrystalline region of the same material, having the same thickness and the same electrical characteristics as the gate region. The polycrystalline region extends preferably along the perimeter of a square and delimits laterally the oxide test region, the area of which is greater than the area of the oxide layer to be measured so as to allow non-destructive testing, on-line, of the oxide layer to be measured during an early stage of the manufacturing process.

8 Claims, 2 Drawing Sheets

STRUCTURE AND METHOD FOR EVALUATING AN INTEGRATED ELECTRONIC DEVICE

TECHNICAL FIELD

The present invention relates to a structure and to a method for evaluating an integrated electronic device. In particular the present invention is intended to measure, on-line, the thickness of an oxide layer extending in a position adjacent to a polycrystalline region.

BACKGROUND OF THE INVENTION

As is known, present MOS microelectronics devices contain oxide layers, the thickness of which is not known with precision. In particular, the thickness of the gate oxide layer (HV oxide for high-voltage components and LV oxide for low-voltage components), which is formed on the surface of the wafer and undergoes the gate definition step, may be undefined for various reasons. First of all, the doping level of the wafer surface region is not known precisely and may vary slightly from batch to batch under the same manufacturing conditions; since the doping level affects the thickness of the oxide layer grown above the surface region (the more the surface region is doped, the greater is oxide layer the thickness) initial uncertainty arises as to the value of this thickness. Moreover, during the gate region definition step, when the polycrystalline silicon layer is etched to remove the useless silicon portions, overetching may occur, causing slight removal of the oxide layer, despite the selectivity of the etching operation. This possible removal may in turn increase the uncertainty as to the thickness. The subsequent gate region re-oxidation step, performed to seal the gate region, may further increase this uncertainty.

The fact of not knowing the thickness of the oxide layer covering the wafer surface during manufacture is disadvantageous since ion implantation steps are performed through this layer (typically for formation of drain and source regions of MOS components), the effectiveness of which (obtainable doping level, implant depth) depends on the oxide thickness. Furthermore, the device final electrical characteristics and hence its ability to pass the final test depends precisely on the conditions of this implant. Consequently, by knowing the thickness of the oxide layer through which implantation of component conductive regions is performed, it is possible to evaluate, at an early stage of the manufacturing process, whether the finished device will, with a good degree of probability, be able to pass the final test or not, eliminating any defective wafers during an early manufacture step and hence reducing the costs associated with manufacturing rejects and carrying out complex final testing steps. Alternatively, using this information it is possible, if necessary, to modify the process parameters so as to adapt them to the given oxide thickness to ensure, at least as regards the characteristics associated with the thickness of the oxide layer, that the final tests are passed.

In view of the above, there currently exists the need of a method for measuring this oxide.

At present, this need has not yet been satisfied and suitable measurement methods do not exist. In fact, the present measurements performed on test chips, for verifying correct operation of the machines for manufacturing microelectronics devices, do not provide significant results since they use substrates which are not doped or in any case have different characteristics from those of the devices intended for commercial distribution, the oxide thickness of which is to be ascertained.

Other currently known methods for measuring the oxide thickness cannot be used on-line since they require sectioning the wafer and examining the obtained section under a scanning electron microscope (SEM) or, as in case of capacitors, they require a predefined minimum thickness (greater than that of the oxide layer to be examined) and/or a large examination area, greater than the zone accommodating the oxide to be measured (typically coinciding with the source and drain regions).

SUMMARY OF THE INVENTION

One object of the invention is therefore to provide a structure and a method allowing the measurement of the thickness of an oxide layer extending above a semiconductor material wafer. According to one embodiment, the thickness of the oxide layer extending on the sides of the polycrystalline regions intended to form the gate regions of MOS components can be measured.

According to a further embodiment of the present invention a structure and a method for evaluating an integrated electronic device are also provided.

The invention will now be described with reference to the accompanying drawings which show a non-limiting example of embodiment thereof, wherein:

DETAILED DESCRIPTION OF THE INVENTION

According to the invention, a test structure is formed by an oxide layer located above a doped monocrystalline region and also by a polycrystalline region formed above the oxide layer at a suitable point of the wafer. The thickness of the various regions and doping of each are selected to ensure maximum similarity between the electrical characteristics of the test structures and those of the operational devices. But the area and location of the test structure are selected to allow measurement thereof using the present machines. Preferably the test structure area has dimensions equal to the minimum dimensions which can be examined by the measurement instrument used. In particular, the wafer surface region on which the structure is formed, the oxide layer of the test structure and the polycrystalline region are formed under the same conditions as the region of the operational devices including the oxide layer, the thickness of which is to be ascertained.

Figure 1:
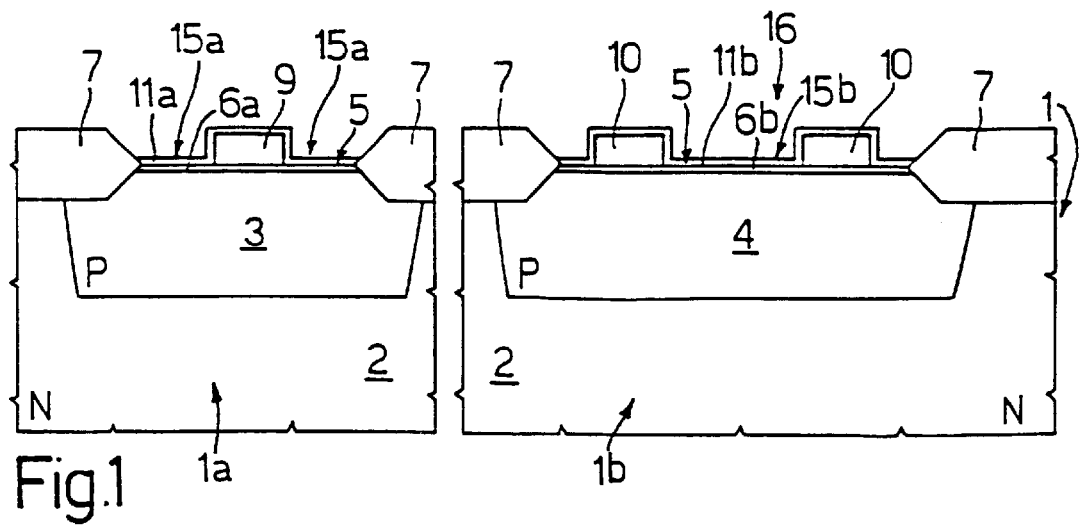
FIG. 1 shows a cross-section through a semiconductor material wafer according to an embodiment of the invention.

In detail, FIG. 1 shows a cross-section through a wafer 1 of semiconductor material comprising a first zone 1a in which an operational device such as an MOS component is to be formed and a second zone 1b in which a test structure is to be formed. The two zones 1a, 1b may be adjacent to or distant from one another; in particular, an area of wafer 1 not otherwise utilized may be used as the zone 1b. In the example shown, wafer 1 is formed by an N-type substrate 2 containing P-type pockets 3, 4, in the zone 1a and in the zone 1b, respectively. In one embodiment, the P pockets are of the same doping concentration and are preferably formed in the same step. Moreover, field oxide or other isolation structures regions 7 extend along the surface 5 of the wafer at selected locations.

Figure 2:
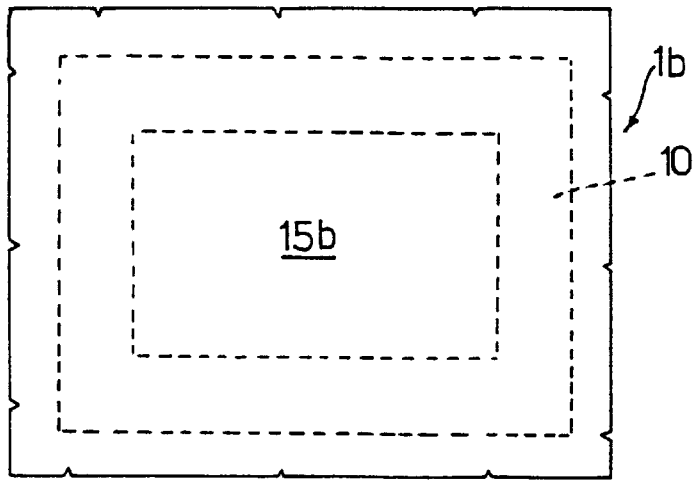
FIG. 2 shows a plan view of a portion of the wafer according to FIG. 1.

A gate oxide layer indicated at 6a in zone 1a and at 6b in zone 1b extends over wafer surface 5, preferably formed in the same step. A polycrystalline silicon gate region 9 is formed above gate oxide layer 6a, in zone 1a, and a polycrystalline region 10, extending along the perimeter of a square and having the shape shown in the plan view of FIG. 2, is formed above the gate oxide layer 6b, in zone 1b. In one embodiment, polycrystalline region 10 has a large area, for example a square, sized between 50×50 $\mu m^2$ and 100×100 $\mu m^2$, preferably 70×70 $\mu m^2$.

The gate region 9 and the polycrystalline region 10 are sealed externally by a sealing layer indicated at 11a in zone 1a and at 11b in zone 1b. The sealing layer 11a, 11b of silicon oxide, is formed through a re-oxidation step, in a per se known manner, and extends also above the exposed portions of the gate oxide layer 6a, 6b so as to form in these zones, overall, first oxide regions indicated 15a and a second oxide region indicated 15b.

In an alternative embodiment, the 11a, 11b can be an oxide of the type formed as the sidewall oxide for spaces on the polysilicon gate, creating the layer 15a, 15b.

In particular, the first oxide regions 15a form the layer, the thickness of which is to be ascertained and is unknown because of uncertainty regarding the initial thickness of the gate oxide layer 6a, 6b and any overetching during definition of the gate region 9 and polycrystalline region 10, as well as, in some cases, regarding the thickness of the sealing layer 11a, 11b. The second oxide region 15b, delimited laterally by polycrystalline region 10 and hence having the indicated above large area, represents the layer to be measured and zone 1b defines a test structure, indicated as a whole 16, Since pockets 3, 4 are formed simultaneously, portions 6a, 6b belong to a same gate oxide layer, as portions 11a, 11b of the sealing layer, gate region 9 and polycrystalline region 10 are formed during simultaneous process steps, the oxide regions 15a, 15b have the same thickness. Moreover, since the area of the second oxide region 15b is much greater than the first oxide region (of the order of 1 $\mu m^2$), its thickness may be measured, on-line, in a non-destructive manner for example through an ellipsometer (for example the machine identified as TENCOR).

Figure 3:
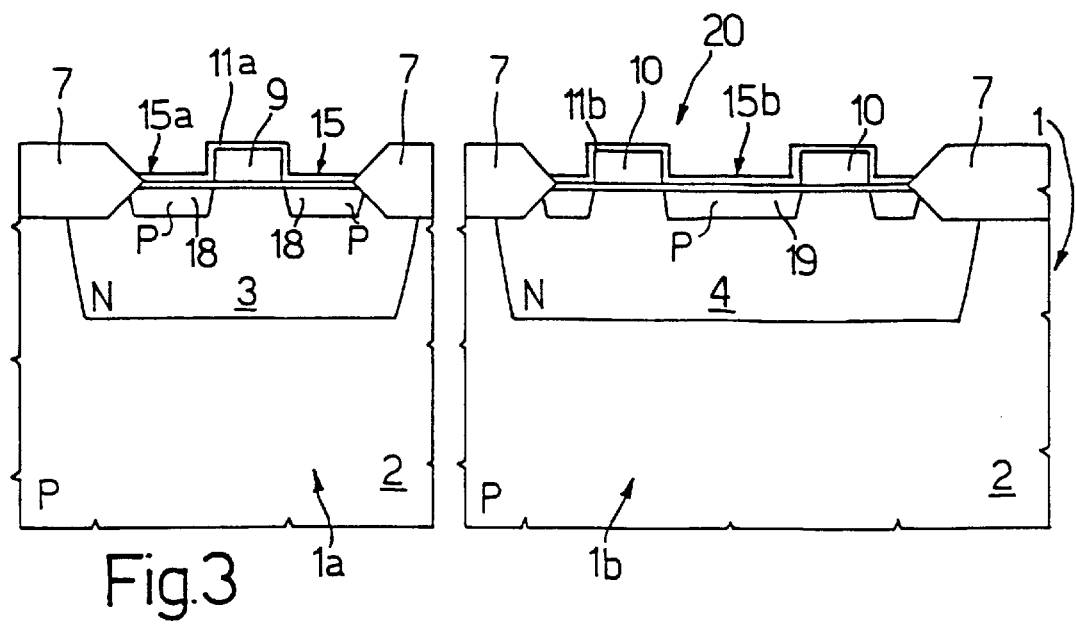
FIG. 3 shows a cross-section, similar to FIG. 1, according to a second embodiment of the invention.

FIG. 3 shows a different embodiment wherein the semiconductor material regions are of the opposite doping type (P-type substrate 2, N-type pockets 3 and 4) and wherein source/drain implanting has already been performed. Consequently, two regions 18, defining source and drain regions of the finished transistor, are present on the sides of gate region 9, and a P-type doped region 19 is present inside the area delimited by the polycrystalline region 10. In one embodiment the regions 18 and 19 may be the final source and drain regions and the transistor a finished transistor. In an alternative embodiment, the regions 18 and 19 are the lightly doped source and drain regions and the layer 15 represents the sidewall oxide.

The overall structure defined by zone 1b, indicated at 20, therefore represents the test structure and allows, with respect to the structure 16 according to FIG. 1, the doping level of the doped region 19 (and therefore the source and drain regions 18) to be linked to the thickness of the second oxide region 15b (and hence the first oxide regions 15a).

In particular, since the thickness of oxide regions 15a, 15b influences implantation and diffusion of source/drain regions 18, 19 and therefore the surface resistance of these regions, during development of the device, it is possible to perform a series of measurements to ascertain exactly, for the specific process under study, the correlation existing between the two parameters (thickness and surface resistance). In particular there is strong evidence that this correlation is linear. In any case, once the correlation between the two parameters has been determined experimentally for the considered manufacturing method, this con-elation may be used during mass-production of the devices to evaluate wafer by wafer (or at least on one wafer of the batch) the quality of the process steps performed and in particular whether the wafer is able to continue in the manufacturing process or must be discarded.

In view of the above, the method for checking the integrated device is described hereinbelow with reference to the flowchart of FIG. 4, wherein the process steps for manufacturing integrated components not influencing the check have been omitted.

In detail, initially and by per se known techniques, pockets 3 and 4 (step 20) are implanted simultaneously; gate oxidation is performed (step 22), so as to grow or deposit the oxide layer 6a, 6b on surface 7 of wafer 1; then the gate region 9 and the polycrystalline region 10 are formed by deposition, if necessary doping ions implantation and subsequent shaping of a polycrystalline silicon layer (step 23); then, in a per se known manner, the wafer is re-oxidized (step 24) so that a thin oxide layer covers and seals regions 9 and 10, and oxide portions 11a and 11b are simultaneously formed. Then wafer 1 is removed from the oxidation oven and undergoes measurement through an ellipsometer in order to evaluate the thickness of the oxide region 15b inside the test structure 16 or 20 (step 26). Then a check is made to verify whether the measured thickness T is within an acceptable range, namely whether it is greater than or equal to a predefined minimum value T1 and is less than or equal to a predefined maximum value T2, so as to ensure that source/drain implantation performed through the oxide layer has the desired electrical characteristics.

If the outcome of the check is positive (output YES to step 30), the wafer undergoes the further manufacturing steps according to the design (step 31) and at the end of the manufacturing steps, after cutting the wafer and separating the individual dices, the test structure is eliminated; in the event of a negative outcome (output NO), the wafer is immediately discarded (step 32).

Figure 4:
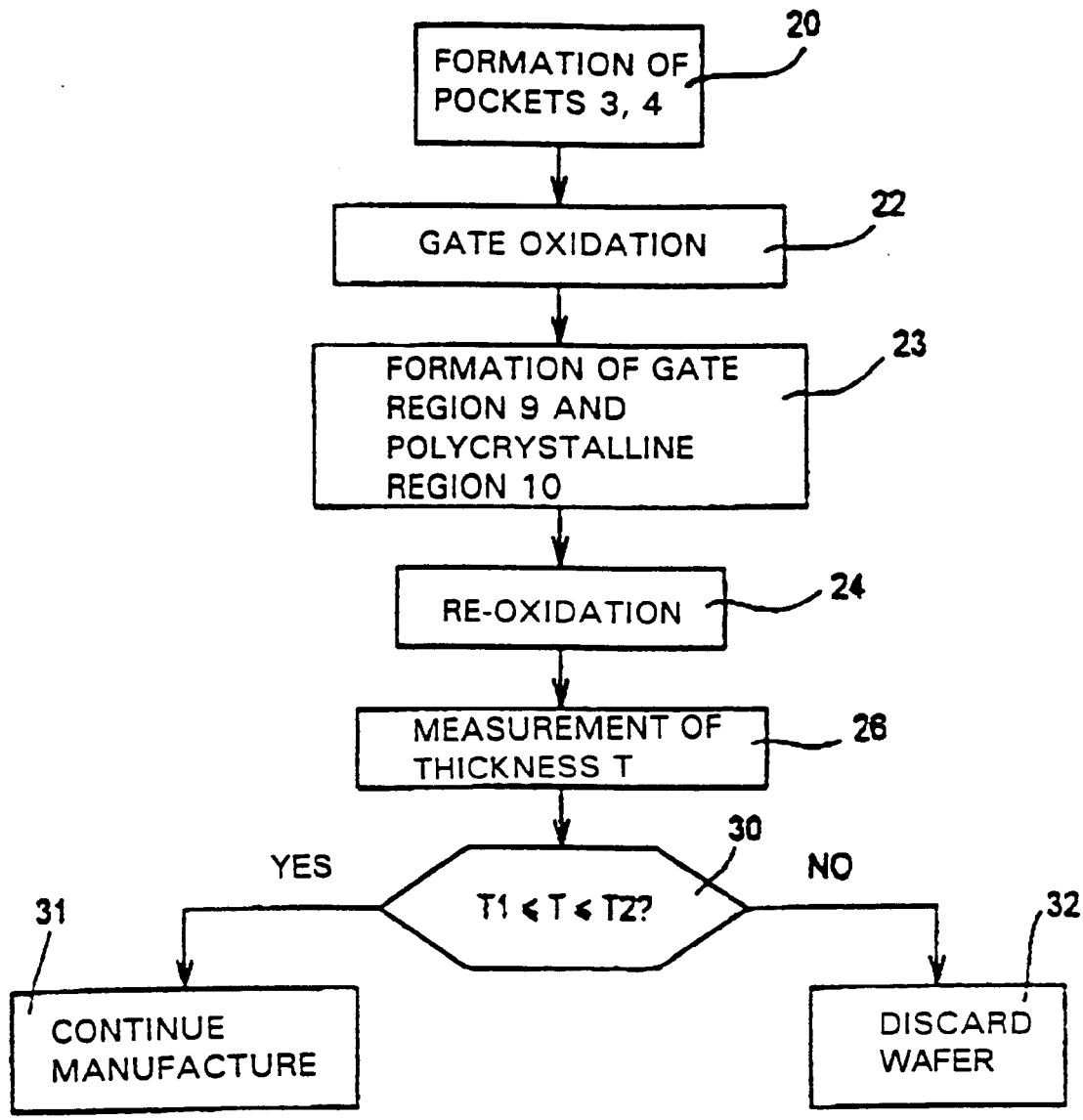
FIG. 4 shows a flowchart of the present method.

During design, when trying to determine, for the considered process, the existing correlation between thickness of oxide regions 15a, 15b and electrical characteristics of source/drain regions 18, a process identical to that described with reference to FIG. 4 is performed, except for the fact that, at the end of the step of re-oxidizing the gate and polycrystalline regions (step 24), implantation of the regions 18 and 19 is performed and, in addition to measurement of the thickness (step 26), measurement of the surface resistance of the regions 18, 19 is also performed.

The check structure and method described have the following advantages: firstly they allow the measurement, on-line, of the oxide thickness without using destructive techniques and with reliable results; moreover they provide important information at an early stage of the manufacturing process (immediately after forming the oxide layer to be measured) and hence allow discarding, where necessary, of defective parts prior to completion of the manufacturing process and carrying out of expensive final tests on the device, thus avoiding unnecessary costs, or, if possible, allow modification of the process parameters so as to compensate for unsuitable thickness values.

The check method and structure described and illustrated here may be subject to modifications and variations without thereby departing from the scope of the present invention. In particular, the invention is applicable to devices of different types, with P-type or N-type doping and to high-voltage or low-voltage devices; in particular, in high-voltage devices the test structure may be formed and subjected to measurement prior to LDD (Low Doped Drain) implantation, in which case the invention allows determination of the correlation between thickness of the oxide and low-doped drain extension regions formed before source/drain implantation, or after etching spacers and actual source/drain implantation, to highlight problems associated with formation of the spacers. Further, the area 15b is shown as square; it could be a rectangle or any suitable shape. The polysilicon region 10 can also be made of a size and shape to permit direct measure on the oxide on top of the polysilicon.

What is claimed is:

1. A structure for checking an integrated electronic device, comprising:

an oxide layer to be measured located above a body of doped semiconductor material and arranged in a position adjacent to a gate region of polycrystalline semiconductor material, said oxide layer to be measured having a first area;

an oxide test region of the same material as said oxide layer and having the same thickness and the same electrical characteristics as said oxide layer; and a polycrystalline region of the same material as said gate region and having the same thickness and the same electrical characteristics as said gate region, said oxide test region having a second area greater than the first area, wherein said polycrystalline region extends along the perimeter of a regular quadrilateral.

2. A structure according to claim 1 wherein said regular quadrilateral is a square.

3. A structure according to claim 1 wherein said polycrystalline region extends along a closed line that delimits an area with dimensions greater than $50 \times 50 \ \mu m^2$.

4. The structure according to claim 1 wherein said polycrystalline region laterally surrounds and delimits said oxide test region.

5. A structure for checking an integrated electronic device, comprising:

a doped semiconductor material body;

a gate region of polycrystalline semiconductor material;

an oxide layer having a thickness to be determined, located above the semiconductor material body, arranged in a position adjacent to the gate region, and having a first area;

a test region positioned on the semiconductor material body, the test region including an oxide test region of a same material as the oxide layer and having a thickness that is equal to the thickness of the oxide layer, the oxide test region having a second area that is greater than the first area and sufficiently large to be measured in a non-destructive manner by an ellipsometer; and a polycrystalline region that completely surrounds the oxide test region, wherein the polycrystalline region extends along a perimeter of a regular quadrilateral.

6. The test structure of claim 5 wherein the regular quadrilateral is a square.

7. The test structure of claim 5 wherein the second area has dimensions greater than or equal to $50 \times 50 \ \mu m^2$.

8. A structure for checking an integrated electronic device, comprising:

a doped semiconductor material body;

a gate region of polycrystalline semiconductor material;

an oxide layer having a thickness to be determined, located above the semiconductor material body, arranged in a position adjacent to the gate region, and having a first area; and a test region positioned on the semiconductor material body, the test region including an oxide test region of a same material as the oxide layer and having a thickness that is equal to the thickness of the oxide layer, the oxide test region having a second area that is greater than the first area and sufficiently large to be measured in a non-destructive manner by a an ellipsometer, wherein the second area is at least 2500 times greater than the first area.

\* \* \* \* \*